United States Patent
Kaza et al.

(10) Patent No.: US 9,449,690 B2
(45) Date of Patent: Sep. 20, 2016

(54) MODIFIED LOCAL SEGMENTED SELF-BOOSTING OF MEMORY CELL CHANNELS

(71) Applicant: Cypress Semiconductor Corporation, San Jose, CA (US)

(72) Inventors: Swaroop Kaza, Woburn, MA (US); Youseok Suh, Cupertino, CA (US); Di Li, Highland, CA (US); Sameer S. Haddad, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 68 days.

(21) Appl. No.: 13/856,313

(22) Filed: Apr. 3, 2013

(65) Prior Publication Data
US 2014/0301146 A1 Oct. 9, 2014

(51) Int. Cl.
| | | |
|---|---|---|
| *G11C 16/02* | (2006.01) | |
| *G11C 16/08* | (2006.01) | |
| *G11C 16/10* | (2006.01) | |
| G11C 16/34 | (2006.01) | |
| G11C 16/04 | (2006.01) | |

(52) U.S. Cl.
CPC ............. *G11C 16/08* (2013.01); *G11C 16/10* (2013.01); *G11C 16/3427* (2013.01); *G11C 16/0483* (2013.01); *G11C 16/3418* (2013.01)

(58) Field of Classification Search
CPC .............. G11C 16/08; G11C 16/3418; G11C 16/3427; G11C 16/10
USPC ........................................ 365/185.23, 185.18
See application file for complete search history.

(56) References Cited

U.S. PATENT DOCUMENTS

| | | | |
|---|---|---|---|
| 2004/0080980 A1* | 4/2004 | Lee ........................ | 365/185.17 |
| 2005/0105334 A1* | 5/2005 | Futatsuyama ............ | 365/185.17 |
| 2006/0198222 A1 | 9/2006 | Rudeck et al. | |
| 2007/0171719 A1 | 7/2007 | Hemink et al. | |
| 2008/0055995 A1* | 3/2008 | Ito ............................ | 365/185.18 |
| 2009/0073761 A1* | 3/2009 | Hemink ................... | 365/185.02 |
| 2010/0002520 A1 | 1/2010 | Lee | |
| 2010/0259992 A1* | 10/2010 | Santin et al. ............ | 365/185.18 |
| 2012/0176838 A1 | 7/2012 | Aritome | |
| 2013/0039125 A1 | 2/2013 | Kim | |
| 2013/0242661 A1* | 9/2013 | Lei et al. ................ | 365/185.17 |

OTHER PUBLICATIONS

International Search Report for International Application No. PCT/US2014/032704 dated Aug. 13, 2014; 4 pages.
Written Opinion of the International Searching Authority for International Application No. PCT/US2014/032704 dated Aug. 13, 2014; 6 pages.

* cited by examiner

*Primary Examiner* — Han Yang
*Assistant Examiner* — Xiaochun L Chen
(74) *Attorney, Agent, or Firm* — Lowenstein Sandler LLP

(57) ABSTRACT

A method of programming a memory system by selectively applying a program voltage to a selected wordline connected to a memory transistor to be programmed. A first bias voltage is applied to a first wordline adjacent to the source side of the selected wordline. The first bias voltage is also applied to a second wordline adjacent to the drain side of the selected wordline. A second bias voltage is applied to a third wordline adjacent to the drain side of the second wordline. A third bias voltage is applied to a fourth wordline adjacent to the source side of the first wordline. A pass voltage is also applied to the remaining wordlines that do not have one of a bias voltage and a program voltage applied, the pass voltage a selected voltage level.

19 Claims, 15 Drawing Sheets

MODIFIED LOCAL SEGMENTED SELF-BOOSTING OF MEMORY CELL CHANNELS

TECHNICAL FIELD

The present disclosure relates generally to the field of non-volatile semiconductor devices and more specifically to the field of programming a flash memory having a NAND-type architecture which utilizes a self-boosting technique to aid programming.

BACKGROUND

Semiconductor memory devices have increasingly been used in a wide variety of electronic devices. Non-volatile semiconductor memory devices are now common in smart phones, tablet computers, personal digital assistants, digital cameras, audio recorders, digital video camcorders, and USB flash drives, to name a few. Such flash memory devices are among the most popular non-volatile semiconductor memories. As electronic devices get smaller and smaller, it becomes desirable to increase the amount of data that can be stored per unit area on an integrated circuit memory element, such as a flash memory unit. Efforts of the semiconductor fabricating industry to produce continuing improvements in miniaturization and packing densities has seen improvements and new challenges in the semiconductor fabricating process.

Flash memory is typically made up of an array of floating gate transistors, commonly referred to as memory cells. One or more bits of data can be stored as charge by each memory cell. FIG. 1 illustrates an exemplary memory cell 100 utilizing a floating gate 102 that is positioned above and insulated from a channel region 104 in a semiconductor substrate 106. In one embodiment, the floating gate 102 is positioned between a first source/drain region 108 and a second source/drain region 110. A control gate 112 is placed over and insulated from the floating gate 102. A threshold voltage of the transistor is controlled by an amount of charge that is retained on its floating gate. The minimum amount of voltage that must be applied to the control gate 112 before conduction occurs between the first source/drain region 108 and the second source/drain region 110 is controlled by a level of charge on the floating gate 102. When conduction occurs between the first source/drain region 108 and the second source/drain region 110, the channel region 104 forms in the semiconductor substrate 106 between the first source/drain region 108 and the second source/drain region 110, and immediately beneath the floating gate 102.

FIG. 2 illustrates a typical two-dimensional array of floating gate memory transistors, or memory cells. FIG. 2 comprises several strings, known as NAND strings of floating gate memory transistors 210. Each transistor 210 of the NAND string is coupled to a next transistor 210 in the NAND string by coupling a source of one transistor 210 to a drain of a next transistor 210 to form bit lines BL1-BLn. Each NAND string illustrated in FIG. 2 includes a select transistor 212, 214 on either end of the string of memory cells. The drain side select transistor 212 connects the NAND strings to respective bit lines (BL1-BLn) and the source side select transistor 214 connects the NAND strings to a common source line 216. FIG. 2 also illustrates a plurality of word lines WL1-WLn running perpendicular to the NAND strings. As illustrated in FIG. 2, each word line (WL1-WLn) connects to the control gate 218 of one memory cell 210 of each NAND string.

In one embodiment, before programming a flash memory device, its memory cells are erased. In one embodiment, memory cells can be erased as part of a batch erase where all the memory cells existing in the memory cell array are erased at the same time. In another method, a memory device can be erased through a block erase, where a block consists of a group of NAND cells arranged in a row direction and sharing a common word line. As described herein, when a memory cell or a plurality of memory cells are erased, electrons are discharged into a semiconductor substrate from floating gates of the selected memory cells and threshold voltages of the selected memory cells are shifted in a negative direction.

In one embodiment, a flash memory device may be programmed by applying a program voltage to the control gate of the target memory cell and placing its bit line to ground. Electrons from the substrate channel may then be injected into the floating gate through a process known as tunneling. When electrons accumulate on the floating gate, the floating gate may become negatively charged and the threshold voltage of the memory cell raised so that the memory cell is in a programmed state. In the case of a NAND-type memory cell, the threshold voltages after data erase are normally "negative" and defined as "1." The threshold voltages after data write are normally "positive" and defined as "0."

When the threshold voltage is negative and a read is attempted, the memory cell will turn on; indicating logic "1" is stored. When the threshold voltage is positive and a read operation is attempted, the memory cell will not turn on; indicating logic "0" is stored. A memory cell can also store multiple bits of digital data, such as in exemplary Multi-Level Cell Architecture (MLC) devices. The range of possible threshold values may determine a number of possible levels of data. For example, if four levels of information are stored, there may be four threshold voltage ranges assigned to the data values "11," "10," "01," and "00." In one example of a NAND-type memory, the threshold voltage after an erasure may be negative and defined as "11." In one embodiment, positive threshold voltages may be used for the states of "10," "01," and "00."

When a memory cell is programmed (with a program signal), all of the memory cells on the same wordline may also receive the program signal. Even though the bit lines on their NAND strings are set to a supply voltage Vcc (e.g. 3-5 V), and inhibited, it may still be possible for another memory cell on the same wordline to be inadvertently programmed (e.g., disturbed). In particular, the memory cell adjacent to the memory cell selected for programming may be especially vulnerable to program disturb.

FIG. 2 illustrates a programmed memory cell S on a wordline WL3 along with inhibited memory cells Q on the same wordline WL3. As illustrated in FIG. 2, the selected bitline BL1 is set to ground and the inhibited bitlines B12-BLn are set to Vcc. The program signal Vpgm is applied to the selected wordline WL3 and is applied to the control gates 218 of the memory cells 210 along the wordline WL3 (e.g., memory cells S and Q). This places the program signal Vpgm on memory cells 210 in both the selected bitline BL1 (memory cell S) and the unselected bitlines BL2-BLn (memory cells Q). As discussed herein, the unintentional programming of an unselected memory cell Q on the selected wordline WL3 is called "program disturb."

There have been many attempts to limit or prevent program disturb. Conventional self-boosting is an exemplary method whereby the unselected bitlines may be electrically isolated and a pass voltage applied to the unselected wordlines during programming. FIG. 3 illustrates conventional global self-boosting. A supply voltage Vcc (e.g. 3-5 V) is applied to both drains 302 and control gates 304 of the unselected drain side select transistors 212 to turn off the unselected drain side select transistors 212, and thereby electrically isolate the unselected bitlines. A pass voltage Vpass (e.g. 10 V) may be applied to the unselected wordlines (WL1, WL2, and WL4-WLn). The unselected wordlines (WL1, WL2, and WL4-WLn) capacitively couple to the unselected bitlines BL2-BLn, causing a voltage (such as about 6 volts) to exist in the channel of the unselected bit lines BL2-BLn, which may reduce program disturb. Self-boosting may reduce the potential difference between channels of the unselected bit lines BL2-BLn and the program signal Vpgm that is applied to the selected wordline WL3. The end result may be reduced voltage across the tunnel oxide and therefore reduced program disturb, especially in the memory cells Q in the unselected bitlines BL2-BLn on the selected wordline WL3.

However, conventional global self-boosting does have its disadvantages. A NAND string is typically programmed from the source side to the drain side. When all but the last few memory cells have been programmed, if all or most of the memory cells on the NAND string being inhibited were programmed, then there may be a negative charge in the floating gates of the previously programmed cells. Because of this negative charge on the floating gates, the boosting potential may not get high enough and there may still be program disturb on the last few wordlines. As illustrated in FIG. 4A, when programming one particular memory cell S, if memory cells B on a source side wordline and adjacent to inhibited memory cells Q on the selected wordline, were already programmed, the negative charge on their floating gates may limit the boosting level of the self-boosting process and possibly cause program disturb on the memory cell Q adjacent to the programmed memory cell S.

Conventional global self-boosting can also suffer from uneven channel voltage. In conventional global self-boosting, channel voltage may not be uniformly distributed if any cell in the string is programmed. Channel voltage on the drain side, with pre-charging, may be higher than the source side. That is, memory cells on the source side may be vulnerable to program disturbs. In other words, when there is non-uniform channel voltage, the voltage is different through the channel. The differences in channel voltage on either side of the programmed memory cell may continue to grow as more memory cells are programmed. Further, there is pattern dependent channel voltage, such that channel voltage may be different from bit line to bit line due to their varying programming/erasure patterns. The channel voltage is boosted in different amounts depending on the threshold voltages of the cells. As a result, when data is written into the selected memory cell in the selected NAND string, the stress due to the programming voltage applied to all the memory cells on the wordline may cause a disturbance in the previously programmed memory cells.

SUMMARY OF THE INVENTION

Embodiments of the present invention provide solutions to the challenges inherent in programming a NAND string of memory cells. In particular, exemplary embodiments provide a method and apparatus for programming a selected memory cell while avoiding the undesired disturbance of adjacent unselected memory cells due to band-to-band tunneling.

A method of programming a memory system by selectively applying a program voltage to a selected wordline connected to a memory transistor to be programmed. A first bias voltage is applied to a first wordline adjacent to the source side of the selected wordline. The first bias voltage is also applied to a second wordline adjacent to the drain side of the selected wordline. A second bias voltage is applied to a third wordline adjacent to the drain side of the second wordline. A third bias voltage is applied to a fourth wordline adjacent to the source side of the first wordline. A pass voltage is also applied to the remaining wordlines that do not have one of a bias voltage and a program voltage applied, the pass voltage a selected voltage level.

In a memory system according to one embodiment of the present invention, a selected memory cell is programmed. A memory system comprises a plurality of strings of memory transistors arranged in parallel to form an array with a plurality of wordlines and an apparatus operable to selectively apply a program voltage to a selected wordline connected to a memory transistor to be programmed. The apparatus is further operable to selectively apply a first bias voltage to a first wordline adjacent to a source side of the selected wordline. The apparatus is further operable to selectively apply the first bias voltage to a second wordline adjacent to a drain side of the selected wordline. The apparatus is operable to selectively apply a second bias voltage to a third wordline adjacent to a drain side of the second wordline. The apparatus is further operable to selectively apply a third bias voltage to a fourth wordline adjacent to a source side of the first wordline. Lastly, the apparatus is operable to selectively apply a pass voltage to the remaining wordlines that do not have one of a bias voltage and a program voltage applied, the pass voltage a selected voltage level.

BRIEF DESCRIPTION OF THE DRAWINGS

The present invention will be better understood from a reading of the following detailed description, taken in conjunction with the accompanying drawing figures in which like reference characters designate like elements and in which.

DETAILED DESCRIPTION

Figure 1:
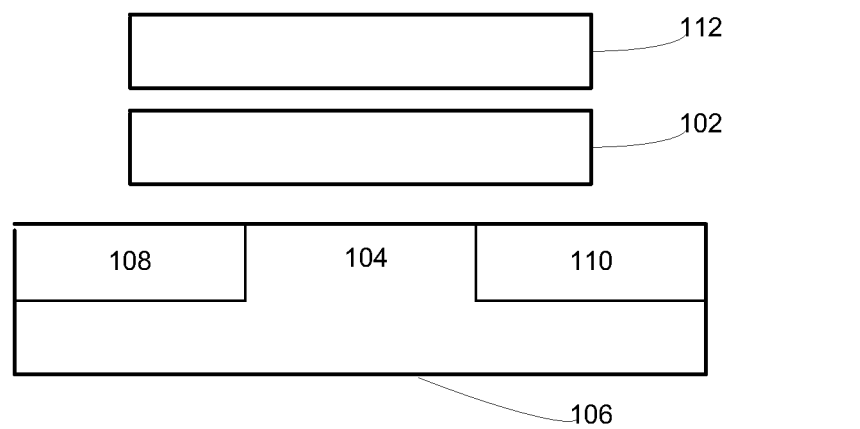
FIG. 1 illustrates an exemplary cross-section of a floating gate memory cell, according to the prior art.
Figure 2:
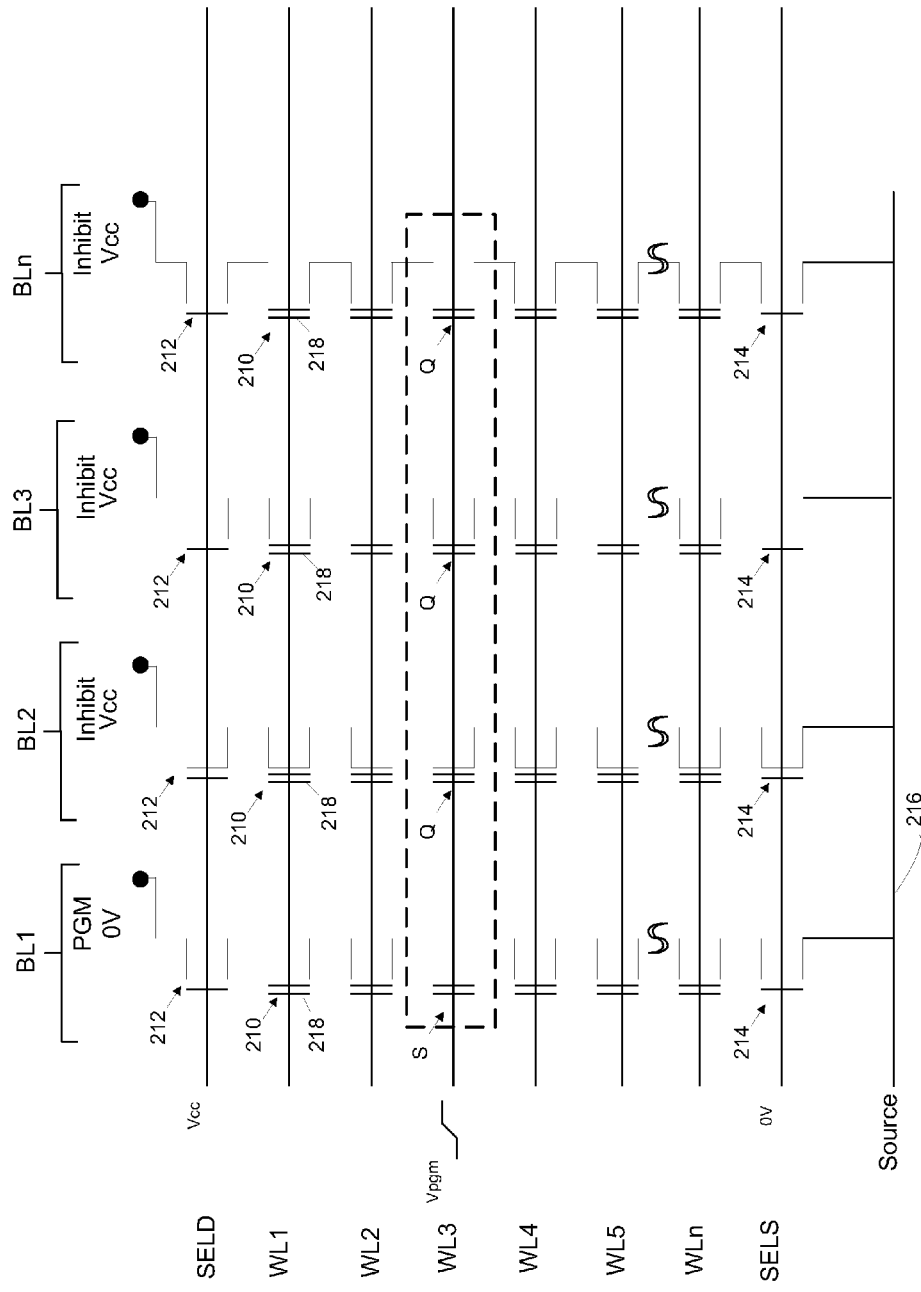
FIG. 2 illustrates an exemplary schematic diagram of a NAND flash memory system, according to the prior art.
Figure 3:
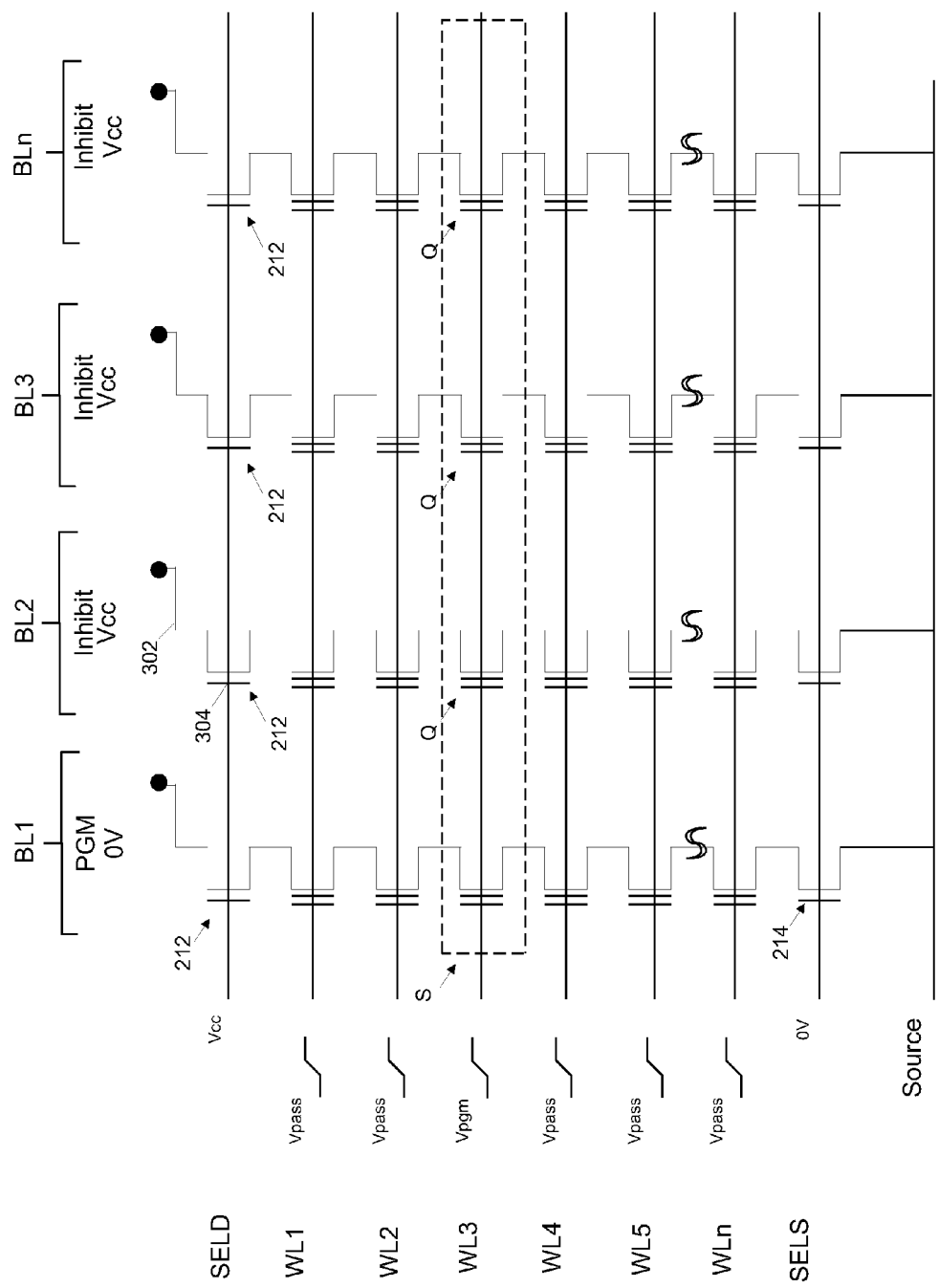
FIG. 3 illustrates an exemplary schematic diagram of a NAND flash memory system, according to the prior art.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature:

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

This present invention provides a solution to the increasing challenges inherent in managing memory cell program management with reduced program disturb. Various embodiments of the present disclosure achieve local boosting of a memory cell segment such that hot-carrier disturb cause by band-to-band tunneling electronics may be significantly reduced or eliminated on unselected memory cells using dummy wordlines in a NAND string. In one exemplary embodiment, a very low pass voltage (e.g., 2 volts) may be used while still adequately inhibited memory cells on either side of a targeted memory cell.

Conventional Attempts to Improve Local Self-Boosting:

Local self-boosting was one scheme created to help deal with the disadvantages inherent in conventional self-boosting methods. T. S. Jung et al. proposed a local self boosting ("LSB") technique in "A 3.3V 128 Mb Multi-Level NAND Flash Memory for Mass Storage Applications," ISSCC96, Session 2, Flash Memory, Paper TP 2.1, IEEE, pp. 32. The system reduces the program voltage stress that causes program disturb and in particular the variance of threshold voltages of memory systems utilizing the Multi-Level Cell architecture (MLC device).

Figure 4A:
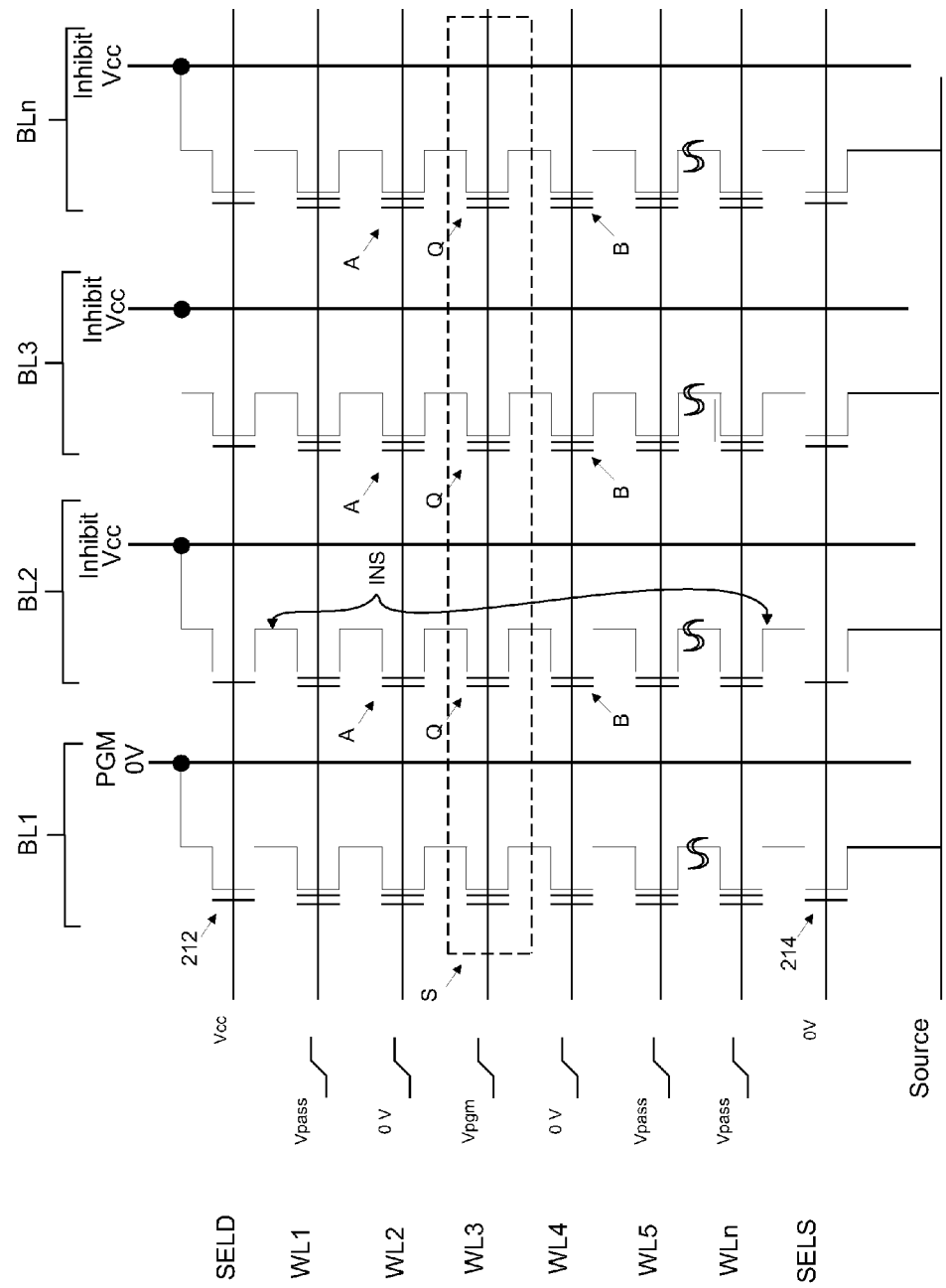
FIG. 4A illustrates an exemplary schematic diagram of a NAND flash memory system, according to the prior art.
Figure 4B:
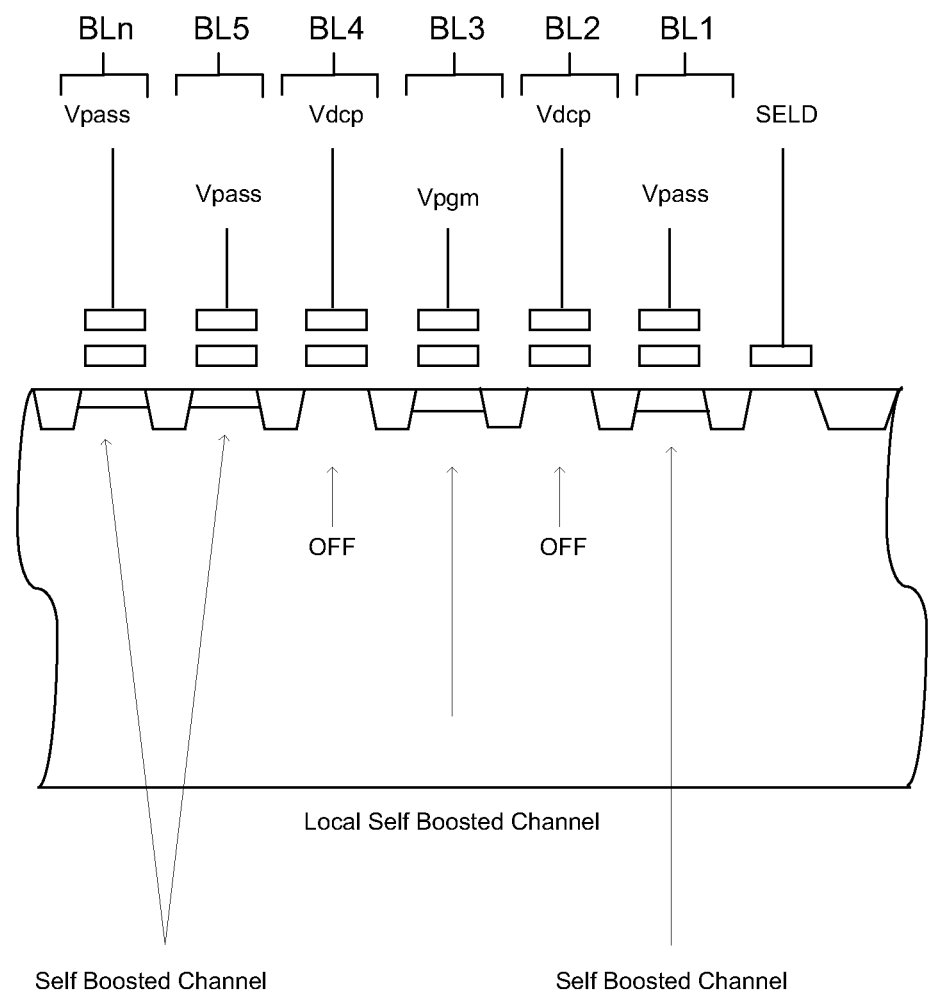
FIG. 4B illustrates an exemplary cross-section of a portion of a NAND flash memory system, according to the prior art.

In the LSB system illustrated in FIGS. 4A and 4B, the bit line BL1 of the memory cell S being programmed is at 0 volts and the bit lines BL2-BLn of memory cells Q to be inhibited are at a supply voltage (e.g. 3-5 V). A program signal Vpgm (e.g. 20 volts) is applied to the selected word line WL3. The word lines WL2, WL4 adjacent to the selected word line WL3 are at 0 volts. A pass voltage Vpass (e.g. 8-12 volts) is applied to the remaining, unselected word lines WL1, WL5-WLn.

In the LSB method, when applying a programming voltage to the selected word line WL3, in order to reduce or prevent program disturb in memory cells 210 on the other inhibited NAND strings INS, 0 volts are applied to the word lines WL2, WL4 on either side of the selected word line WL3, so that the two memory cells above A and below B the inhibited memory cell Q are "turned off" With the adjacent memory cells A, B, "turned off," the channel voltage of the inhibited cell Q will not be influenced by the self-boosting in the channels of the adjacent memory cells A, B. With the program signal Vpgm applied to the selected word line WL3, the channel of the inhibited memory cell Q may be locally self-boosted to a voltage level that is higher than could be reached when the inhibited memory cell's channel region is influenced by the self boosting of the other memory cells in the same inhibited NAND string INS. The result is prevented or reduced incidents of program disturb.

Care must taken when selecting an appropriate pass voltage level. For the LSB method to work, the memory cells adjacent to the inhibited memory cell must be turned off regardless of the data stored. These adjacent memory cells can have arbitrary threshold voltage levels of either a positive or a negative threshold voltage. To "shut off" these adjacent memory cells by means of the back-bias effect caused by the channel voltage, the pass voltage must be at a level sufficient to increase the lowest threshold voltage likely seen. However, the pass voltage must not be set too high. As the pass voltage increases, the variation in threshold voltage increases as well. A threshold voltage may be increased or decreased enough to change its programmed logic state. In other words, if a pass voltage is too low, self boosting in the channels will be insufficient to prevent program disturb, but if the pass voltage is too high, unselected word lines may be reprogrammed.

Figure 5:
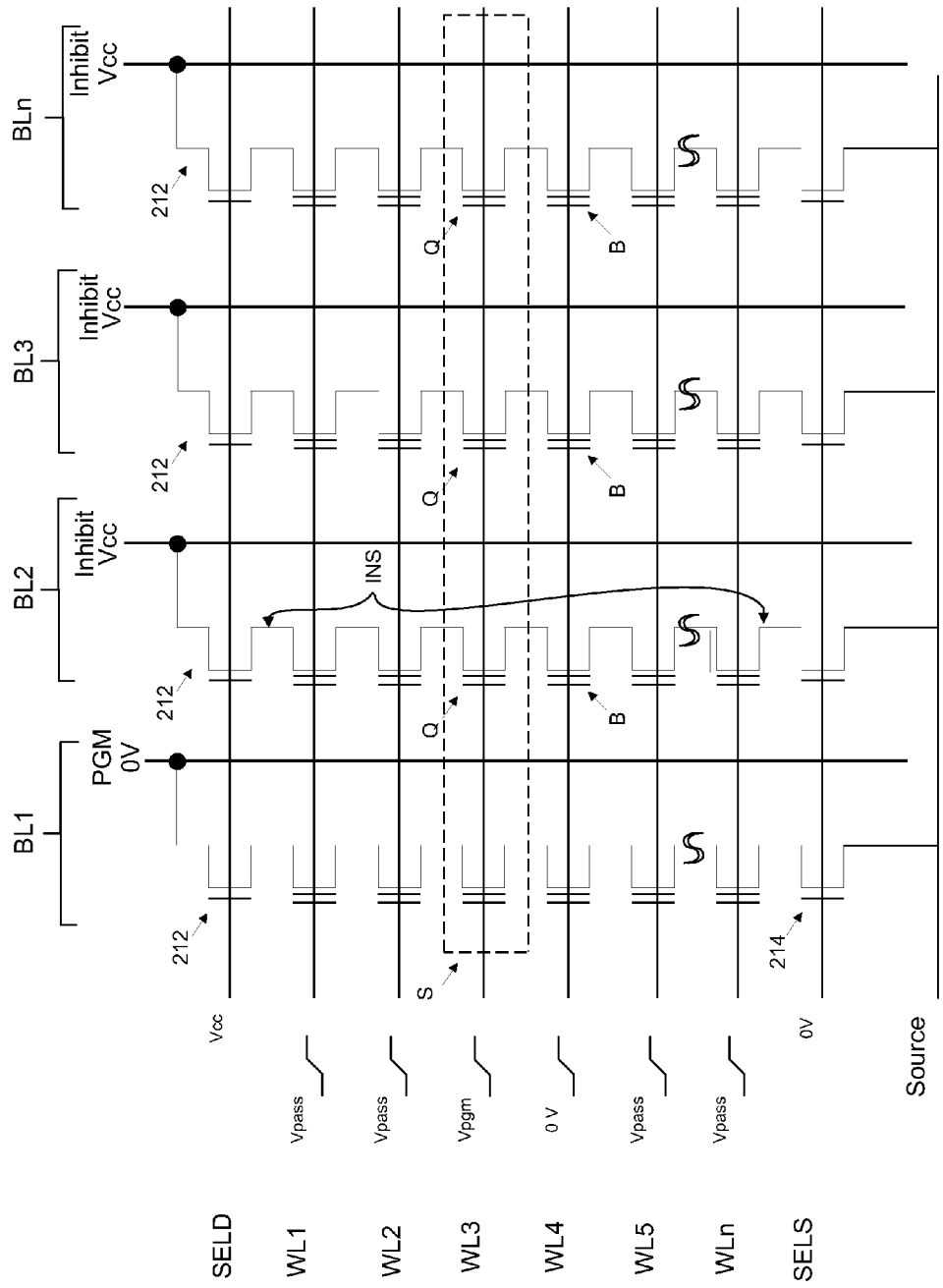
FIG. 5 illustrates an exemplary diagram of a NAND flash memory system, according to the prior art.

Tanaka et al. proposed an Erased Area Self-Boosting (EASB) system, U.S. Pat. No. 6,525,964, to deal with some of the disadvantages of conventional LSB. The EASB scheme may be applied to the conventional memory cell array that uses NAND strings and word lines, wherein the word lines are attached to one memory cell from each NAND string in the row. As illustrated in FIG. 5, to program a specific memory cell S, a program signal Vpgm (e.g. 20 volts) is applied to the word line WL3 connected to the control gate of the specific memory cell S. The word line WL4 adjacent to the selected word line WL3 on the source side is set to a level below the programming signal, such as 0 volts. A pass voltage Vpass (e.g. 8-12 volts) is applied to all the remaining word lines WL1-WL2, WL4-WLn. The pass voltage Vpass is selected to be below the level of the program signal Vpgm, but above the voltage level of the signal applied to the adjacent, source side word line WL4.

EASB may result in more uniform channel voltage and is less vulnerable to leakage, but the inhibited memory cell's Q channel voltage is lower than when using the LSB scheme. However, there is less junction leakage. Therefore, a higher channel voltage from self-boosting for a given pass voltage may be possible with EASB when compared to LSB.

The EASB scheme is also affected by whether the source side adjacent memory cell B has been programmed or erased, as the state of the source side adjacent memory cell B will influence the channel voltage of the inhibited memory cell Q. If the adjacent source side memory cell B is programmed, there is a negative charge on its floating gate, and the threshold voltage of the memory cell B will likely be positive. Zero volts are applied to its control gate. This results in a highly reverse biased junction under the negatively charged floating gate which can result in Gate Induced Drain Leakage (GIDL). GIDL involves electrons leaking into the self boosted channel. GIDL occurs when there is a large bias in the junction and a low or negative floating gate voltage. This is the case when the source side adjacent memory cell B is already programmed and the drain junction is boosted. GIDL will cause the self boosted voltage to leak away prematurely, resulting in a programming error. If the current leakage is high enough, the self-boosted voltage level in the channel will drop with an increased risk for program disturb. In addition, the closer the selected word line WL3 is to the drain side select transistor 212, the less charge there will be in the boosted junction. Thus, the voltage in the self boosted junction will drop quicker, increasing the risk for program disturb.

If the adjacent source side memory cell B is erased, then there is a positive charge on the floating gate and the threshold voltage of the transistor B will likely be negative. The memory cell B may not even turn off when 0 volts is applied to its word line. And if the memory cell B is still on, the inhibited NAND string INS is not operating in EASB mode, but rather in the previously discussed conventional LSB mode. This is most likely to happen when other memory cells on the source side word lines WL4-WLn are already programmed, which tends to limit source side self-boosting.

Figure 6:
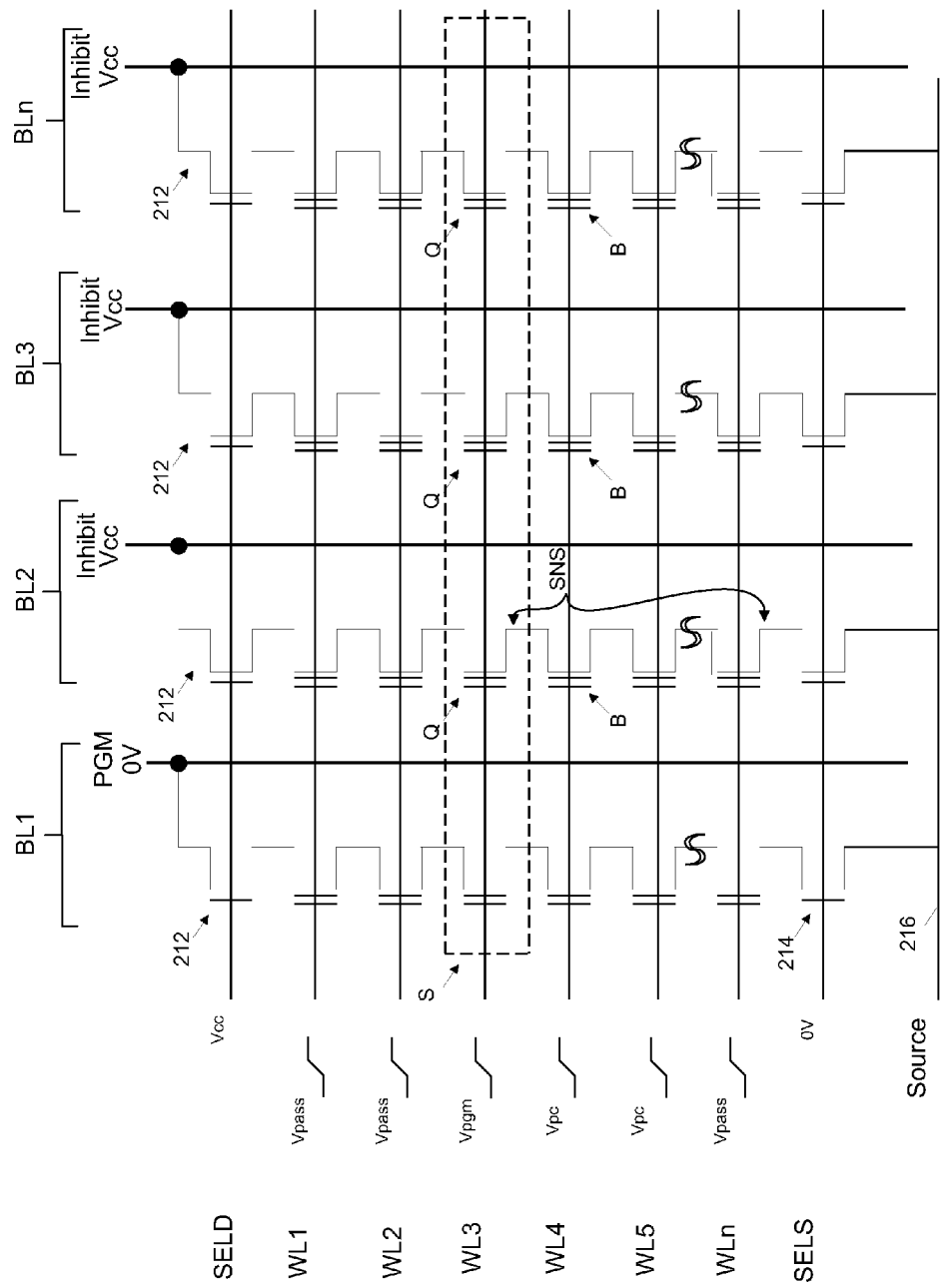
FIG. 6 illustrates an exemplary diagram of a NAND flash memory system, according to the prior art.

Lutze et al. proposed an Erased Area Self Boosting (EASB) system with pre-charging, U.S. Pat. No. 6,975,537, to deal with some of the limitations of LSB and EASB for programming a conventional memory array. The EASB scheme proposed by Lutze may be applied to the conventional memory cell array that uses NAND strings and word lines, wherein the word lines are attached to one memory cell from each NAND string in the row. This EASB scheme is illustrated in FIG. 6. Before the program signal Vpgm (e.g. 18-20 volts) is applied to the word line WL3 of the selected memory cell S, the channel voltage of the source side of the inhibited NAND string SNS is first increased.

The step of pre-charging the source side channel voltage of the inhibited NAND string SNS includes applying a pre-charge voltage Vpc to the adjacent source side word line WL4 and to at least one more of the other source side word lines. Application of the pre-charge voltage Vpc is commenced prior to applying a pass voltage Vpass (e.g. V).

A supply voltage, or Vcc, (e.g. 3-5 volts) is applied to the drain region and to the control gate of the drain side select transistor 212 connected to the bit line BL2-BLn containing the cell Q to be inhibited. The supply voltage Vcc is also applied to the source line 216 connected to the source side select transistor 214, but the source side select transistor control gate remains at 0 volts. As illustrated in FIG. 6, a pre-charge voltage Vpc may be applied to the adjacent source side word line WL4 as well as to at least one other source side word line WL5. By applying the pre-charge voltage Vpc to the unselected source side word lines WL4-WL5, the source side channel voltage SNS is boosted to a voltage of Vcc-Vt, where Vt is the threshold voltage of the drain side select transistor 212. The drain side channel voltage is at Vcc-Vt.

Figure 7:
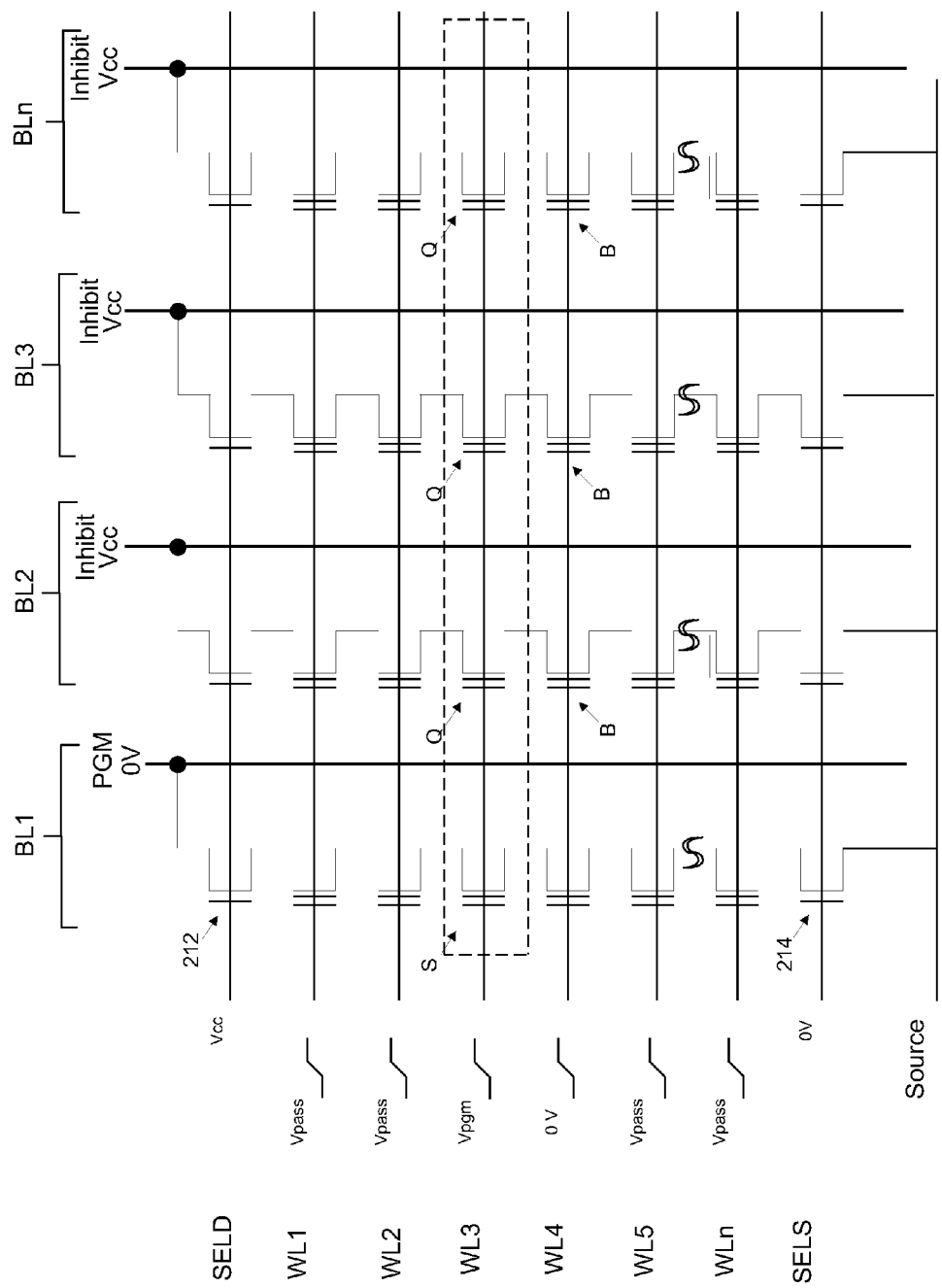
FIG. 7 illustrates an exemplary diagram of a NAND flash memory system, according to the prior art.

As illustrated in FIG. 7, after the pre-charge phase is completed, a programming phase may begin. An exemplary program signal Vpgm is applied to the selected word line WL3, while a pass voltage Vpass is applied to the unselected word lines WL1-WL2 on the drain side of the selected word line WL3 (originally they were at 0 V). The pass voltage Vpass is also applied to the unselected word lines WL5-WLn on the source side except for the adjacent source side word line WL4. The drain region and control gate of the drain side select transistor 212 are both held at Vcc. Meanwhile, the word line WL4 connected to the adjacent source side memory cell B is lowered to 0 volts.

Hemink proposed a buffered bias with EASB or LSB, U.S. Pat. No. 7,161,833, attempting to improve on the LSB and EASB programming schemes. These alternative LSB and EASB schemes with buffered biasing may be applied to the conventional memory cell array that uses NAND strings and word lines, wherein the word lines are attached to one memory cell from each NAND string in the row.

The scheme according to Hemink proposed applying a biasing voltage Vpb ranging from 0 volts to some small positive voltage (e.g. 1-3 V) below the level of a pass voltage Vpass (e.g. 8-12 V) to two or more word lines (preferably adjacent) on the source side of the selected word line (for the EASB scheme). The same biasing voltage may be applied to one or more word lines (preferably adjacent) on the drain side of the selected word line as well as the source side of the selected word line (for the LSB scheme). The above described scheme should result in reduced incidents of current leakage, especially junction leakage and a reduction of programming errors and program disturb.

Figure 8:
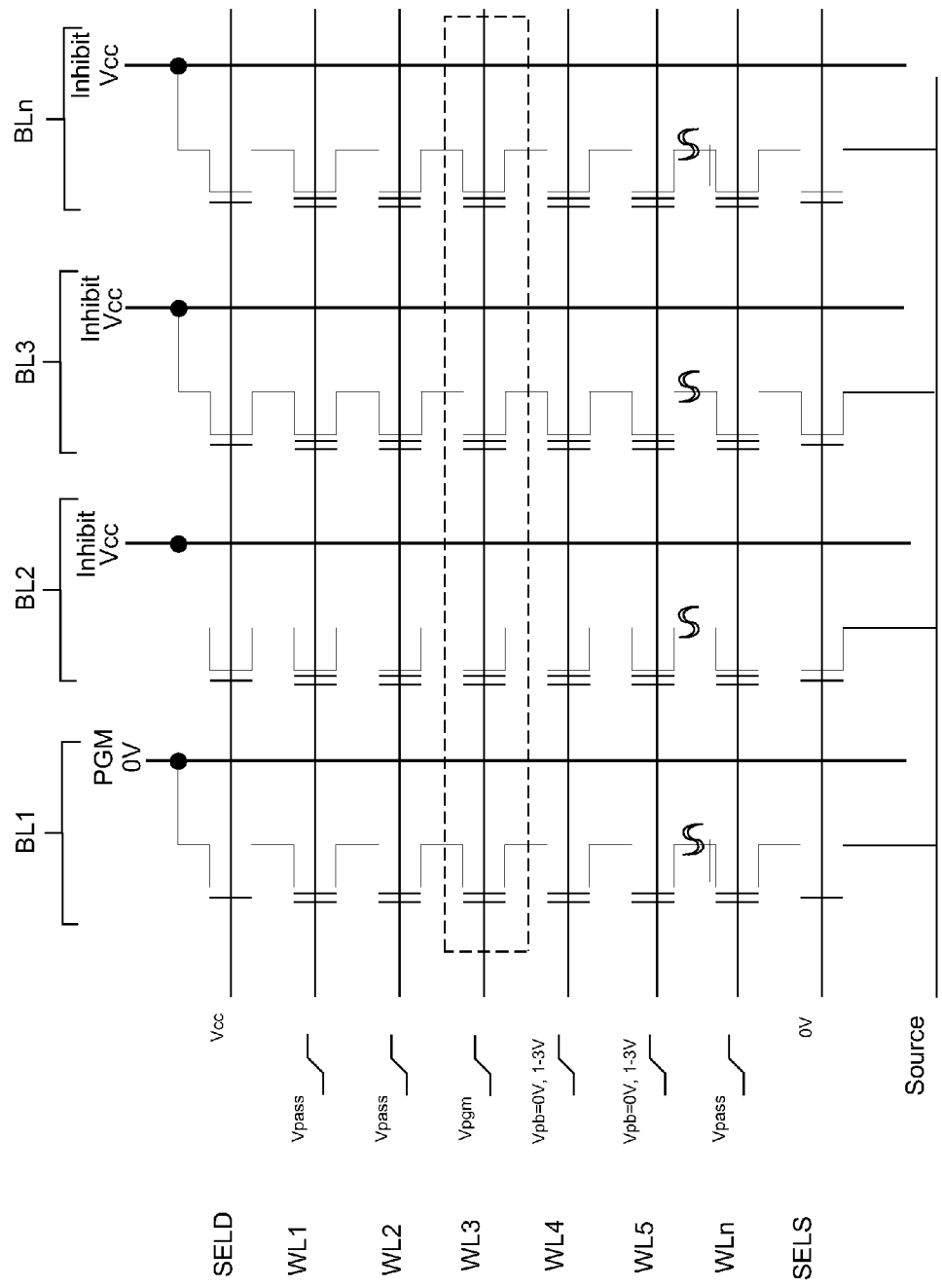
FIG. 8 illustrates an exemplary diagram of a NAND flash memory system, according to the prior art.

An embodiment of the modified EASB scheme is illustrated in FIG. 8. Two word lines WL4, WL5 (preferably adjacent) on the source side of the selected word line WL3 were grounded. The pass voltage Vpass was applied to all of the word lines WL1, WL2 on the drain side. Optionally, two or more word lines on the source side may be grounded, and may be separated from the selected word line WL3 by one or more word lines. The modified EASB scheme increases the channel length of the isolation region, helping to further reduce program disturb.

Current leakage and particularly junction leakage may still occur between the grounded memory cells and the memory cells being programmed, and between the grounded memory cells and the memory cells to which the pass voltage has been applied. To further improve programming, rather than grounding the two word lines WL4, WL5 on the source side of the selected word line WL3, a low positive voltage Vpb may be applied instead (e.g. 1-3 V). This small voltage Vpb applied to the source side word lines WL4, WL5 suppresses current leakage while remaining adequate enough to isolate the two boosted regions in the EASB scheme.

Figure 9:
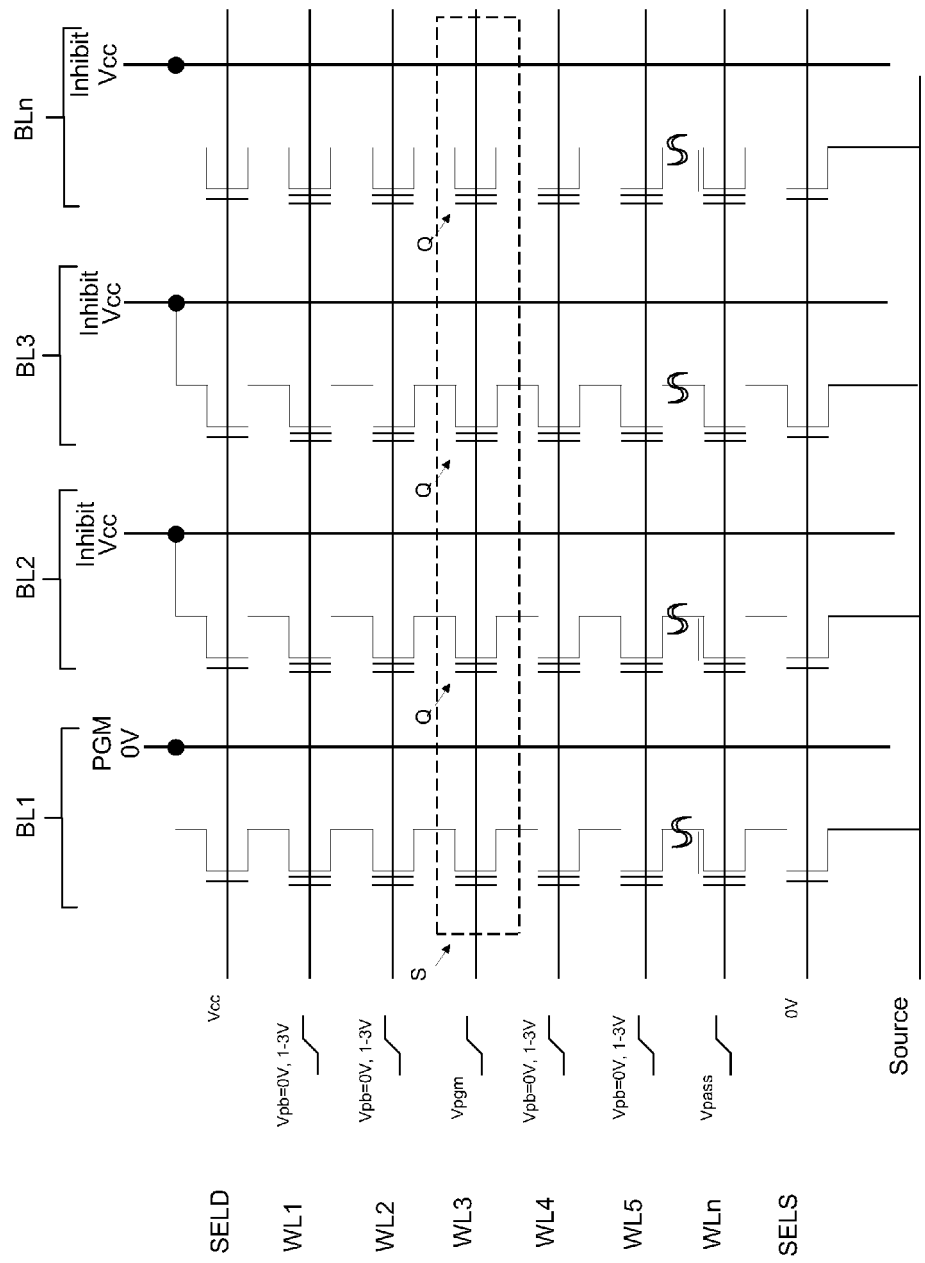
FIG. 9 illustrates an exemplary diagram of a NAND flash memory system, according to the prior art.

The same buffered bias scheme may also be applied to conventional LSB. As illustrated in FIG. 9, two or more word lines (preferably adjacent) on both the source side and drain side of the selected word line WL3 are biased. Zero or low positive voltage levels Vpb (e.g. 1-3 V) are applied as desired to further reduce current leakage, program disturb, and/or altered threshold voltage levels.

Modified Local Segmented Self-Boosting of Memory Cell Channels:

As discussed herein, conventional self-boosting requires a very high level of pass voltage to inhibit neighboring memory cells. But, as also discussed herein, higher pass voltages may inhibit the targeted memory cell and result in an unsatisfactory programming of the targeted memory cell. For example, in conventional global self-boosting, a pass voltage of almost 10-12 volts may be required. Further, in conventional local self-boosting, a pass voltage of almost 8 volts may still be required. In one embodiment, local self-boosting may result in band-to-band tunneling. When 0 volts is applied to the neighboring memory cells on either side of the selected wordline, and a programming voltage is applied to the selected wordline, hot electrons may be created through band-to-band tunneling, that once released may disturb the other memory cell on the selected wordline that is not on the selected string.

In selecting a pass voltage, several trade-offs may result. For example, a pass voltage sufficient to inhibit the surrounding memory cells (on the targeted bit line) may be high enough that in addition to inhibiting the surrounding memory cells, the pass voltage may also inhibit the targeted memory cell (e.g., the targeted memory cell may not program correctly or its programming level affected (program disturb). However, if the pass voltage is too low, the memory cell on the selected wordline that is not on the selected bit line may be disturbed.

As described herein, in one exemplary embodiment, a very low pass voltage (e.g., 2 volts) may be used while still adequately inhibiting memory cells on either side of a targeted memory cell. As discussed herein, pushing hot electrons further away from the affected memory cell may prevent the affected memory cell from experiencing program disturb. The further away the hot electrons are, the less likely the hot electrons will reach the affect memory cell. As discussed herein, a pair of dummy wordlines (with corresponding dummy memory cells) allow a region of a NAND string above and below the targeted memory cell to be shut off. This may push the band-to-band tunnel further away from and prevent any program disturb in the affected memory cell. With the use of dummy wordlines, a region may be shut off even when the programmed wordline is the first wordline WL1 or the last wordline WLn.

Figure 10:
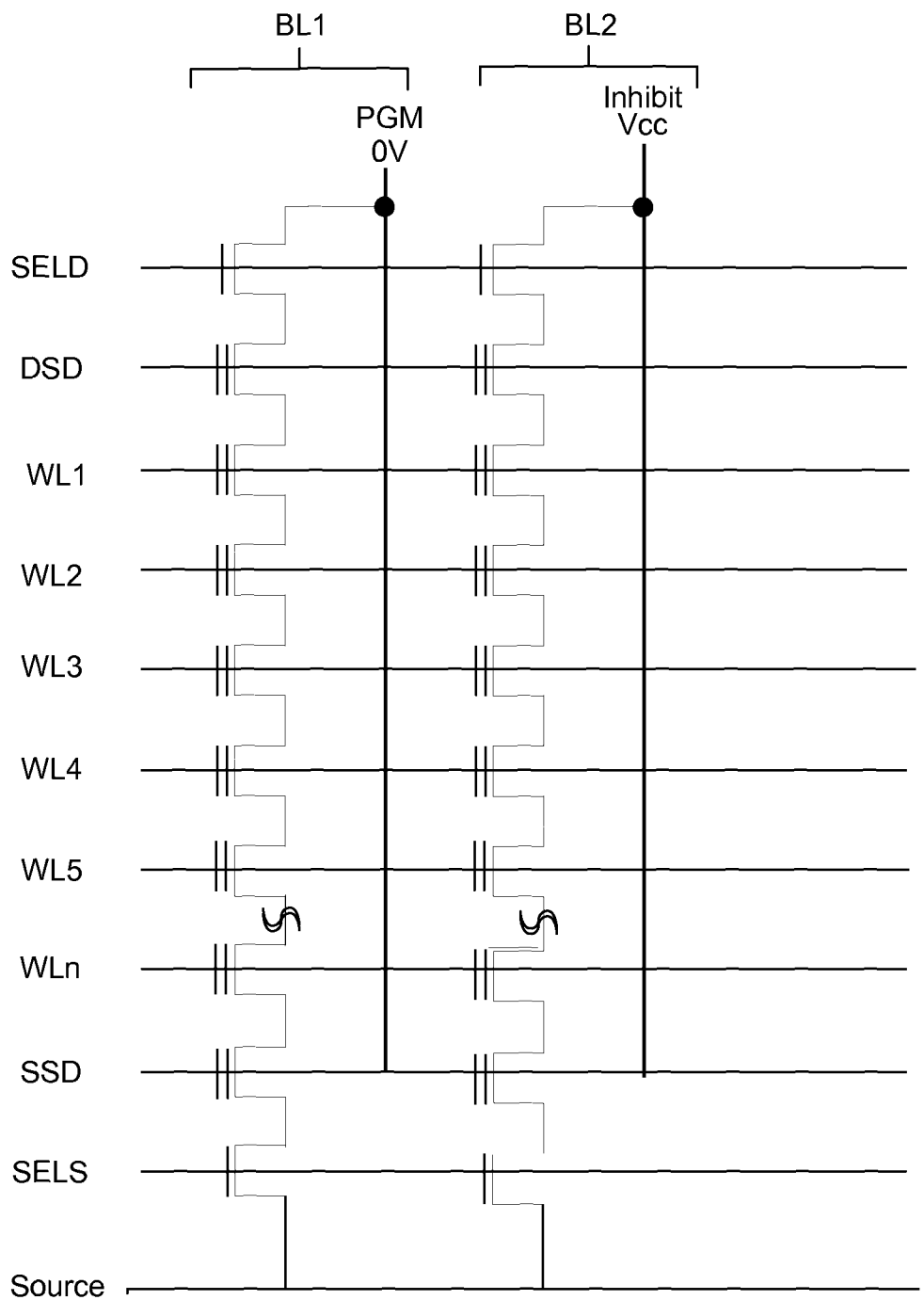
FIG. 10 illustrates an exemplary diagram of a NAND flash memory system, in accordance with an embodiment of the present invention.

FIG. 10 illustrates an exemplary improved local self-boosting of a memory cell channel segment. As described herein, exemplary local self-boosting may prevent punch-through leakage and thereby eliminate Fowler-Nordheim (FN) disturb on a selected wordline and unselected bitline (e.g. an inhibited memory cell). As illustrated in FIG. 10, an exemplary NAND memory system may comprise a pair of dummy wordlines: a drain side dummy (DSD) and a source side dummy (SSD). As discussed herein, the dummy wordlines allow a pair of wordlines to be shut off on either side of a selected wordline, even if the selected wordline is a first (WL1) or last (WLn) wordline. As discussed below, the wordlines shut down on either side of the selected wordline may include a drain side select wordline SELD and a drain side dummy wordline DSD, or a source side dummy wordline SSD and a drain side select wordline SELS.

In one exemplary embodiment, as illustrated in FIG. 10, each NAND string comprises N memory cells, where each NAND string further comprises N−4 memory cells available for addressing and programming (each of these memory cells of the NAND string connecting to a corresponding wordline WL1-WLn). As illustrated in FIG. 10, the four remaining memory cells in each NAND string comprise two dummy cells (a source side dummy and a drain side dummy) connecting to a source side dummy wordline SSD and a drain side dummy wordline DSD, respectively, and a source side select wordline SELS and a drain side select wordline SELD.

As illustrated in FIG. 10, rather than a conventional N−2 addressable and programmable memory cells in each NAND string, exemplary embodiments comprise N−4 addressable and programmable memory cells in a NAND string. In one exemplary embodiment, each NAND string comprises additional memory cells to make up a source side dummy memory cell and a drain side dummy memory cell. In one exemplary embodiment, each NAND string comprises four or more dummy memory cells interconnecting with four or more corresponding dummy wordlines. In one embodiment, a first wordline may be labeled wordline WL1. In another embodiment, the first wordline may be labeled WL0.

Figure 11:
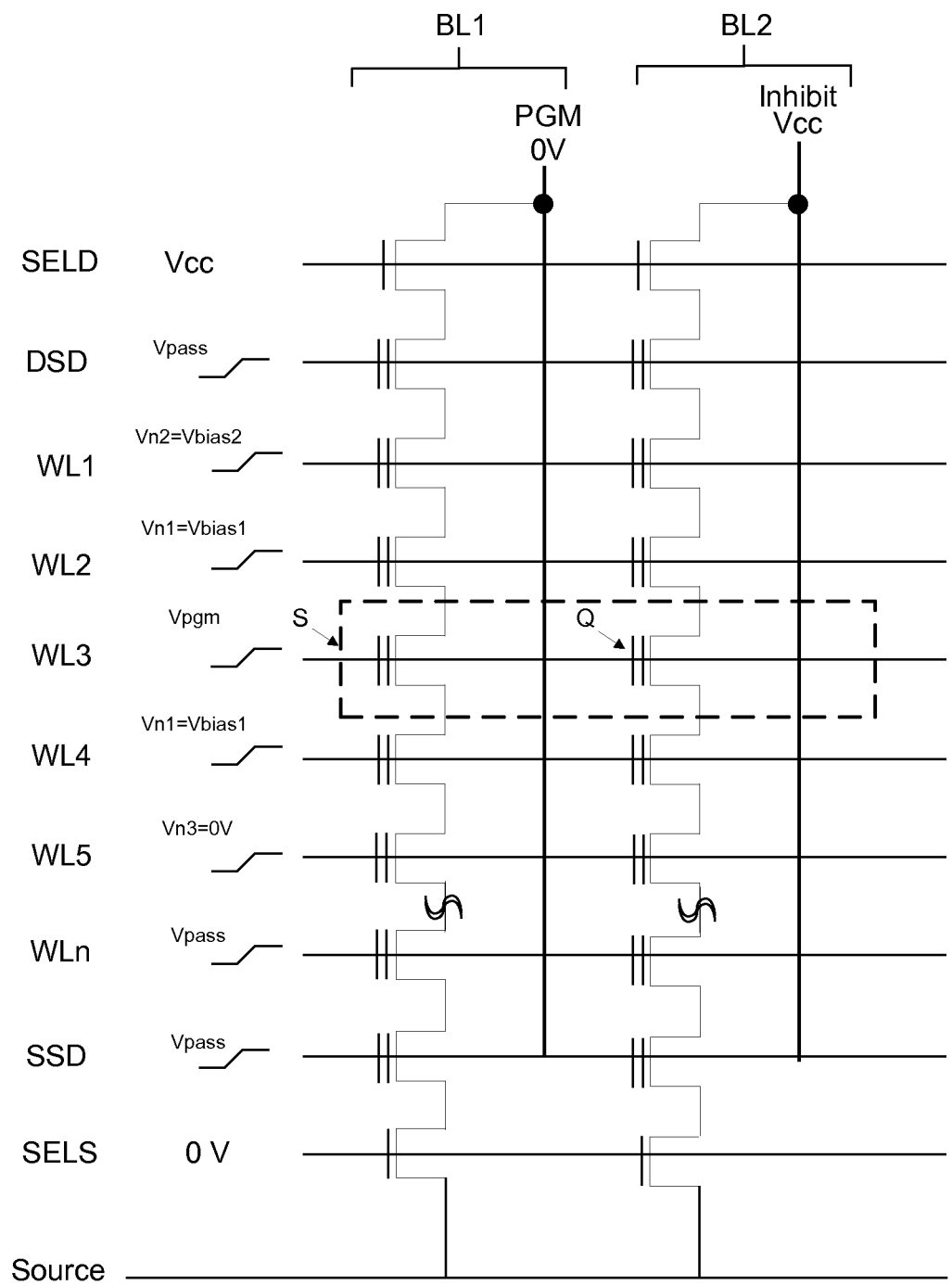
FIG. 11 illustrates an exemplary diagram of a NAND flash memory system, in accordance with an embodiment of the present invention.

FIG. 11 illustrates the NAND flash memory system of FIG. 10 with an exemplary "inner" wordline programming arrangement. As illustrated in FIG. 11, a programming voltage Vpgm is applied to a middle wordline, such as wordline WL3. An exemplary first bias voltage Vbias1 may be applied to a source-side wordline WL4 adjacent to wordline WL3, and a drain-side wordline WL2 also adjacent to wordline WL3. An exemplary second bias voltage Vbias2 may be applied to a drain-side wordline WL1, adjacent to wordline WL2. An exemplary third bias voltage of 0 V may be applied to source-side wordline WL5, adjacent to wordline WL4. An exemplary pass voltage Vpass may be applied to all other wordlines below WL5 to WLn and the drain side dummy wordline DSD and the source side dummy wordline SSD. As illustrated in FIG. 11, the drain side select wordline SELD is set to Vcc and the source side select wordline SELS is set to O volts.

In one exemplary embodiment, a pass voltage Vpass of 8 volts is used. In one exemplary embodiment, a pass voltage Vpass of less than 8 volts is used. In one exemplary embodiment, a pass voltage Vpass of approximately 2 volts is used. As illustrated in FIG. 11, a supply voltage, Vcc (e.g., 3-5 volts) is applied to the drains and control gates of the unselected drain side select transistors (through the unselected bitlines (e.g. BL2) and the drain side select wordline SELD). In one exemplary embodiment, the first and second bias voltages may be any of a series of different bias volts (e.g., 0-3 volts). In one exemplary embodiment, the second bias voltage may be approximately 2-3 volts. In one embodiment, the programming voltage may be approximately 18 volts.

Figure 12:
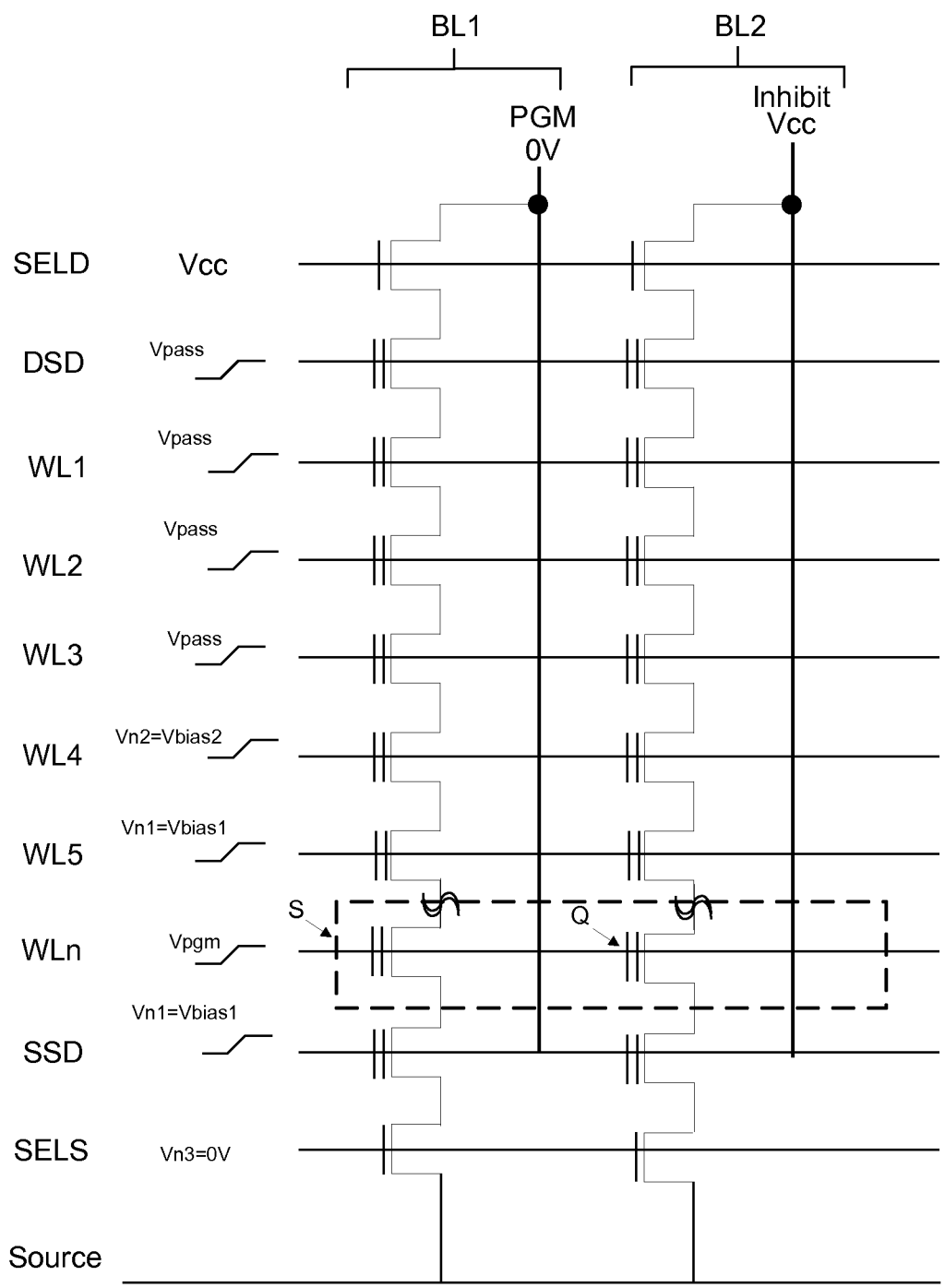
FIG. 12 illustrates an exemplary diagram of a NAND flash memory system, in accordance with an embodiment of the present invention.

FIG. 12 illustrates the NAND flash memory system of FIG. 10 with an exemplary last wordline WLn programming arrangement. As illustrated in FIG. 12, a programming voltage Vpgm may be applied to the last addressable and programmable wordline, wordline WLn. An exemplary first bias voltage Vbias1 may be applied to a source-side wordline SSD (the source side dummy wordline) adjacent to wordline WLn, and a drain-side wordline WL5 adjacent to wordline WLn (e.g., wordline WLn−1). An exemplary second bias voltage Vbias2 may be applied to a drain-side wordline WL4 adjacent to the wordline WL5. An exemplary third bias voltage of 0 V may be applied to the source side select wordline SELS which is adjacent to the source side dummy wordline SSD. An exemplary pass voltage Vpass may be applied to all other wordlines (WL1-WL3) and the drain side dummy wordline DSD. As illustrated in FIG. 12, the drain side select wordline SELD is at Vcc.

Figure 13:
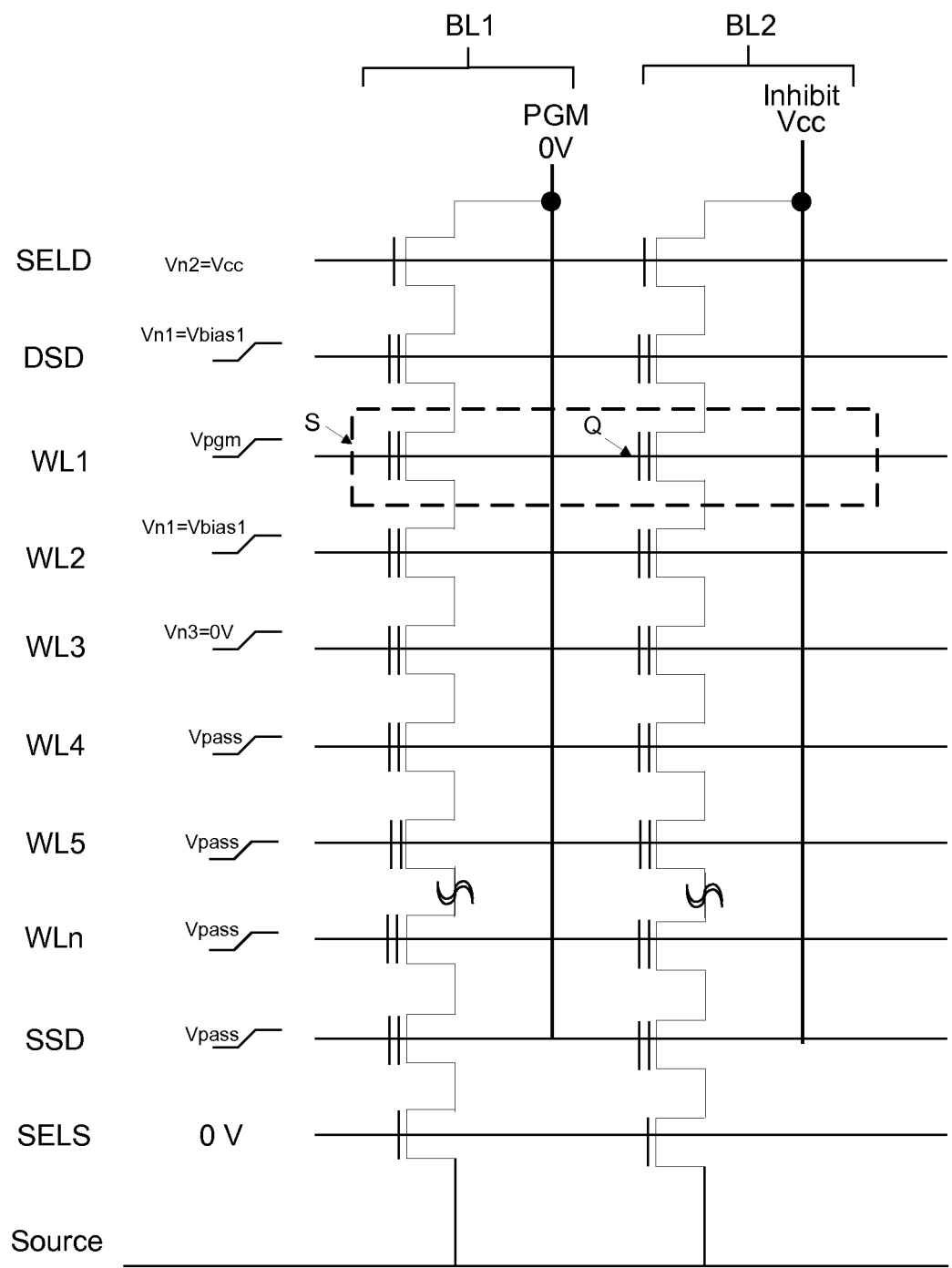
FIG. 13 illustrates an exemplary diagram of a NAND flash memory system, in accordance with an embodiment of the present invention.

FIG. 13 illustrates the NAND flash memory system of FIG. 10 with an exemplary first wordline (WL1) programming arrangement. As illustrated in FIG. 13, a programming voltage Vpgm may be applied to wordline WL1. An exemplary first bias voltage Vbias1 may be applied to a source side wordline WL2 adjacent to wordline WL1 and to a drain side dummy wordline DSD adjacent to wordline WL1. An exemplary second bias voltage Vbias2 may be applied to a drain side select wordline SELD, which is adjacent to the drain side dummy wordline DSD. An exemplary third bias voltage of 0 volts may be applied to the wordline WL3, which is adjacent to wordline WL2. An exemplary pass voltage Vpass may be applied to all other wordlines (e.g., WL4-WLn and the source side dummy wordline SSD). As illustrated in FIG. 13, the source side select wordline SELS is at 0 V. In one exemplary embodiment, the second bias voltage Vbias2 is a supply voltage, Vcc.

Figure 14:
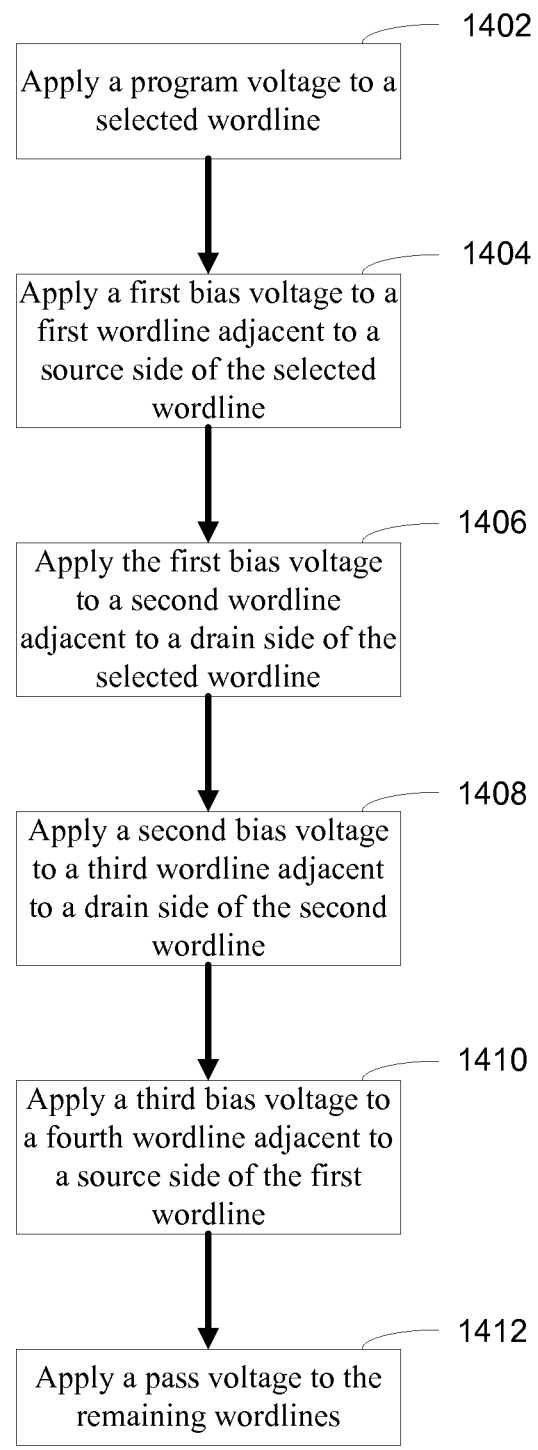
FIG. 14 illustrates steps to an exemplary process for programming a NAND flash memory system, in accordance with an embodiment of the present invention.

FIG. 14 illustrates the steps to a method for programming a memory system. In step 1402 of FIG. 14, a program voltage is selectively applied to a selected wordline connected to a memory transistor to be programmed. In step 1404 of FIG. 14, a first bias voltage is applied to a first wordline adjacent to a source side of the selected wordline. In step 1406 of FIG. 14, the first bias voltage is applied to a second wordline adjacent to a drain side of the selected wordline. In step 1408 of FIG. 14, a second bias voltage is applied to a third wordline adjacent to a drain side of the second wordline. In step 1410 of FIG. 14, a third bias voltage is applied to a fourth wordline adjacent to a source side of the first wordline. In step 1412 of FIG. 14, a pass voltage is applied to the remaining wordlines that do not have one of a bias voltage and a program voltage applied. In one embodiment, the pass voltage is a selected voltage level.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method of programming a memory system, the method comprising:
  selectively applying a program voltage to a selected wordline connected to a memory transistor to be programmed;
  applying a first bias voltage to a first wordline adjacent to a source side of the selected wordline;
  applying the first bias voltage to a second wordline adjacent to a drain side of the selected wordline;
  applying a second bias voltage to a third wordline adjacent to a drain side of the second wordline;
  applying a third bias voltage to a fourth wordline adjacent to a source side of the first wordline, wherein the third bias voltage is different than the second bias voltage; and
  selectively applying a pass voltage to remaining wordlines that do not have one of the first bias voltage, the second bias voltage, the third bias voltage, or the program voltage applied, the pass voltage being at a selected voltage level.

2. The method according to claim 1, wherein the third bias voltage is set to ground.

3. The method according to claim 1, wherein the first bias voltage is approximately 0-2 volts and the second bias voltage is approximately 2-3 volts.

4. The method according to claim 1, wherein the program voltage is approximately 18 volts.

5. The method according to claim 1, wherein one of the third wordline and the fourth wordline is a dummy wordline.

6. An apparatus for programming a memory system, the apparatus comprising:
  a memory device coupled to receive a program signal, wherein the memory device, in response to the program signal, is configured to perform the following:
    selectively apply a program voltage to a selected wordline connected to a memory transistor to be programmed;
    apply a first bias voltage to at least one first wordline adjacent to a source side of the selected wordline;
    apply the first bias voltage to at least one second wordline adjacent to a drain side of the selected wordline;
    apply a second bias voltage to a third wordline adjacent to a drain side of the at least one second wordline;
    apply a third bias voltage to a fourth wordline adjacent to the source side of the at least one first wordline, wherein the third bias voltage is different than the second bias voltage; and
    selectively apply a pass voltage to remaining wordlines that do not have one of the first bias voltage, the second bias voltage, the third bias voltage, and or the program voltage applied, the pass voltage being at a selected voltage level.

7. The apparatus according to claim 6, wherein the at least one first wordline comprises a single first wordline.

8. The apparatus according to claim 6, wherein the at least one first wordline comprises two or more first wordlines.

9. The apparatus according to claim 6, wherein the at least one second wordline comprises a single second wordline.

10. The apparatus according to claim 6, wherein the at least one second wordline comprises two or more second wordlines.

11. The apparatus according to claim 6, wherein the third bias voltage is set to ground.

12. The apparatus according to claim 6, wherein the first bias voltage is approximately 0-2 volts and the second bias voltage is approximately 2-3 volts.

13. The apparatus according to claim 6, wherein the program voltage is approximately 18 volts.

14. The apparatus according to claim 6, wherein one of the third wordline and the fourth wordline is a dummy wordline.

15. A memory system comprising:
   a plurality of strings of memory transistors arranged in parallel to form an array with a plurality of wordlines; and
   a circuit coupled to the plurality of strings of memory transistors, the circuit to:
   selectively apply a program voltage to a selected wordline connected to a memory transistor to be programmed;
   selectively apply a first bias voltage to a first wordline adjacent to a source side of the selected wordline;
   selectively apply the first bias voltage to a second wordline adjacent to a drain side of the selected wordline;
   selectively apply a second bias voltage to a third wordline adjacent to a drain side of the second wordline;
   selectively apply a third bias voltage to a fourth wordline adjacent to a source side of the first wordline, wherein the third bias voltage is different than the second bias voltage; and
   selectively apply a pass voltage to remaining wordlines that do not have one of the first bias voltage, the second bias voltage, the third bias voltage, or the program voltage applied, the pass voltage being at a selected voltage level.

16. The memory system according to claim 15, wherein the third bias voltage is set to ground.

17. The memory system according to claim 15, wherein the first bias voltage is approximately 0-2 volts and the second bias voltage is approximately 2-3 volts.

18. The memory system according to claim 15, wherein the program voltage is approximately 18 volts.

19. The memory system according to claim 15, wherein one of the third wordline and the fourth wordline is a dummy wordline.

* * * * *